United States Patent
Qing et al.

(10) Patent No.: US 12,082,445 B2
(45) Date of Patent: Sep. 3, 2024

(54) DISPLAY PANEL AND METHOD FOR MANUFACTURING SAME, AND ELECTRONIC DEVICE

(71) Applicants: Chengdu BOE Optoelectronics Technology Co., Ltd., Sichuan (CN); BOE Technology Group Co., Ltd., Beijing (CN)

(72) Inventors: Wanmei Qing, Beijing (CN); De Yuan, Beijing (CN); Wenbiao Ding, Beijing (CN); Chao Kong, Beijing (CN); Baiqiang Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 271 days.

(21) Appl. No.: 17/508,945

(22) Filed: Oct. 22, 2021

(65) Prior Publication Data
US 2022/0130927 A1    Apr. 28, 2022

(30) Foreign Application Priority Data
Oct. 26, 2020    (CN) .......................... 202011157714.5

(51) Int. Cl.
*H10K 59/122*    (2023.01)
*H10K 71/00*    (2023.01)
*H10K 59/12*    (2023.01)

(52) U.S. Cl.
CPC .......... *H10K 59/122* (2023.02); *H10K 71/00* (2023.02); *H10K 59/1201* (2023.02)

(58) Field of Classification Search
CPC ... H10K 59/122; H10K 59/1201; H10K 71/00
(Continued)

(56) References Cited

U.S. PATENT DOCUMENTS

| | | | |
|---|---|---|---|
| 2005/0046342 A1* | 3/2005 | Park | H10K 59/122 313/506 |
| 2013/0140530 A1 | 6/2013 | Kho et al. | |

(Continued)

FOREIGN PATENT DOCUMENTS

| | | |
|---|---|---|
| CN | 103137879 A | 6/2013 |
| CN | 108598278 A | 9/2018 |

(Continued)

OTHER PUBLICATIONS

CN202011157714.5 Notification to grant patent for invention.

*Primary Examiner* — Dzung Tran
(74) *Attorney, Agent, or Firm* — IPro, PLLC

(57) ABSTRACT

Provided is a method for manufacturing a display panel. First, the method includes sequentially preparing an anode layer and a first pixel define layer on a side of a substrate layer, then coating an organic light-induced material on a first surface, distal from the anode layer, of the first pixel define layer, and forming a polymer film layer by reacting the first pixel define layer with the organic light-induced material under a predetermined condition, and then preparing an organic functional layer and a cathode layer on a surface, distal from the first pixel define layer, of the organic light-induced material. The organic light-induced material at least contains a hydroxyl group and an unsaturated carbon-carbon double bond.

10 Claims, 4 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2017/0133443 | A1* | 5/2017 | Nendai | ................ H10K 50/813 |
| 2018/0113383 | A1* | 4/2018 | Matsumoto | ............. G03F 7/105 |
| 2018/0261656 | A1* | 9/2018 | Kim | ...................... H10K 71/621 |
| 2020/0064734 | A1* | 2/2020 | Li | ........................... C08K 5/08 |
| 2021/0028255 | A1 | 1/2021 | Gong et al. | |

FOREIGN PATENT DOCUMENTS

| | | |
|---|---|---|
| CN | 109728204 A | 5/2019 |
| CN | 110085772 A | 8/2019 |
| CN | 110379839 A | 10/2019 |
| CN | 111584568 A | 8/2020 |
| CN | 111799374 A | 10/2020 |
| WO | 2020172930 A1 | 9/2020 |

\* cited by examiner

DISPLAY PANEL AND METHOD FOR MANUFACTURING SAME, AND ELECTRONIC DEVICE

CROSS-REFERENCE TO RELATED APPLICATION

This application is based on and claims priority to the Chinese Patent Application No. 202011157714.5, filed on Oct. 26, 2020 and entitled "METHOD FOR MANUFACTURING OLED PANEL, OLED PANEL AND ELECTRONIC DEVICE," the disclosure of which is herein incorporated by reference in its entirety.

TECHNICAL FIELD

The present disclosure relates to the field of display technologies, and more particularly, relates to a display panel and a method for manufacturing the same, and an electronic device.

BACKGROUND

In recent years, due to the characteristics of organic light-emitting diode (OLED) display panels, such as self-luminescence, wide viewing angle, wide color gamut, high contrast, light-weight, foldability, flexibility and portability, the OLED display panels are widely used in smartwatches, smartphones, vehicle-mounted terminals, and other products.

In the related art, an OLED display panel includes a plurality of sub-pixels with different colors and a pixel define layer (PDL). Each of the sub-pixels is provided with a light emission region, and the pixel define layer is configured to define the light emission region of each of the sub-pixels.

SUMMARY

Embodiments of the present disclosure provide a display panel and a method for manufacturing the same, and an electronic device. In one aspect of the embodiments of the present disclosure, a method for manufacturing a display panel is provided. The method includes: sequentially preparing an anode layer and a first pixel define layer on a surface of a substrate layer; coating an organic light-induced material on a surface, distal from the anode layer, of the first pixel define layer, and forming a polymer film layer by reacting the first pixel define layer with the organic light-induced material under a predetermined condition, wherein the organic light-induced material at least includes a hydroxyl group and an unsaturated carbon-carbon double bond; and preparing an organic functional layer and a cathode layer, wherein both the organic functional layer and the cathode layer are disposed on a surface, distal from the first pixel define layer, of the organic light-induced material.

In some embodiments, the predetermined condition at least includes ultraviolet light irradiation.

In some embodiments, forming the polymer film layer by reacting the first pixel define layer with the organic light-induced material under the predetermined condition includes: forming a first intermediate under ultraviolet light irradiation by decomposing the first pixel define layer; forming a fourth intermediate by reacting the first intermediate with the hydroxyl group of the organic light-induced material; and forming a first polymer by polymerizing the fourth intermediate with the unsaturated carbon-carbon double bond of the organic light-induced material; and the polymer film layer at least includes the first polymer.

In some embodiments, the organic light-induced material further includes a benzophenone functional group; and the first polymer at least includes the benzophenone functional group.

In some embodiments, forming the polymer film layer by reacting the first pixel define layer with the organic light-induced material under the predetermined condition includes: a first intermediate under ultraviolet light irradiation by decomposing the first pixel define layer; forming a second intermediate under ultraviolet light irradiation by decomposing the first intermediate; forming a fifth intermediate by reacting the second intermediate with the hydroxyl group of the organic light-induced material; and forming a second polymer by polymerizing the fifth intermediate with the unsaturated carbon-carbon double bond of the organic light-induced material; and the polymer film layer at least includes the second polymer.

In some embodiments, the organic light-induced material further includes the benzophenone functional group; and the second polymer at least includes the benzophenone functional group.

In some embodiments, upon coating the organic light-induced material on the surface, distal from the anode layer, of the first pixel define layer, and forming the polymer film layer by reacting the first pixel define layer with the organic light-induced material, the method further includes: preparing a second pixel define layer on a surface of the organic light-induced material distal from the first pixel define layer; and preparing the organic functional layer and the cathode layer includes: preparing the organic functional layer and the cathode layer, distal from the organic light-induced material, on a surface of the second pixel define layer.

In some embodiments, forming the polymer film layer by reacting the first pixel define layer with the organic light-induced material under the predetermined condition includes: forming a second intermediate under ultraviolet light irradiation by the first intermediate; forming a fifth intermediate by reacting the second intermediate with the hydroxyl group of the organic light-induced material; forming a second polymer by polymerizing the fifth intermediate with the unsaturated carbon-carbon double bond of the organic light-induced material;

the polymer film layer at least includes the second polymer, and the second polymer at least includes the benzophenone functional group;

coating the organic light-induced material on the surface, distal from the anode layer, of the first pixel define layer, and forming the polymer film layer by reacting the first pixel define layer with the organic light-induced material under the predetermined condition further include: preparing a second pixel define layer on a surface, distal from the first pixel define layer, of the organic light-induced material; and preparing the organic functional layer and the cathode layer includes: preparing the organic functional layer and the cathode layer on a surface, distal from the organic light-induced material, of the second pixel define layer.

In another aspect of the embodiments of the present disclosure, a method for manufacturing a display panel is provided. The method includes: preparing an anode layer on a surface of a substrate layer; preparing a third pixel define layer on a surface, distal from the substrate layer, of the anode layer, wherein materials of the third pixel define layer include a pixel define material and an organic light-induced material mixed in the pixel define material; forming a modified third pixel define layer by reacting the pixel define material with the organic light-induced material under a predetermined condition, wherein the organic light-induced material at least includes a hydroxyl group and an unsaturated carbon-carbon double bond; and preparing an organic functional layer and a cathode layer on a surface, distal from the anode layer, of the third pixel define layer.

In some embodiments, the predetermined condition at least includes ultraviolet light irradiation.

In some embodiments, forming the modified third pixel define layer by reacting the pixel define material with the organic light-induced material under the predetermined condition includes: forming a first intermediate under ultraviolet light irradiation by decomposing a pixel define material in the third pixel define layer; forming a fourth intermediate by reacting the first intermediate with the hydroxyl group of the organic light-induced material; and forming a first polymer by polymerizing the fourth intermediate with the unsaturated carbon-carbon double bond of the organic light-induced material; and the modified third pixel define layer at least includes the first polymer.

In some embodiments, the organic light-induced material further includes a benzophenone functional group; and the first polymer at least includes the benzophenone functional group.

In some embodiments, forming the modified third pixel define layer by reacting the pixel define material with the organic light-induced material under the predetermined condition includes: forming a first intermediate under ultraviolet light irradiation by decomposing the pixel define material in the third pixel define layer; forming a second intermediate under ultraviolet light irradiation by decomposing the first intermediate; forming a fifth intermediate by reacting the second intermediate with the hydroxyl group of the organic light-induced material; and forming a second polymer by polymerizing the fifth intermediate with the unsaturated carbon-carbon double bond of the organic light-induced material; and the modified third pixel define layer at least includes the second polymer.

In some embodiments, the organic light-induced material further includes the benzophenone functional group; and the second polymer at least includes the benzophenone functional group.

In some embodiments, a doping amount of the organic light-induced material accounts for 0.1% to 0.5% of a total amount of the pixel define material of the third pixel define layer.

In some embodiments, forming the modified third pixel define layer by reacting the pixel define material with the organic light-induced material under the predetermined condition further includes: forming a second intermediate under ultraviolet light irradiation by decomposing the first intermediate; forming a fifth intermediate by reacting the second intermediate with the hydroxyl group of the organic light-induced material; and forming a second polymer by polymerizing the fifth intermediate with the unsaturated carbon-carbon double bond of the organic light-induced material; and the modified third pixel define layer at least includes the second polymer, and the second polymer at least includes the benzophenone functional group; the doping amount of the organic light-induced material accounts for 0.1% to 0.5% of the total amount of the pixel define material in the third pixel define layer.

In still another aspect of the embodiments of the present disclosure, a display panel is provided. The display panel includes a substrate layer, and an anode layer, a first pixel define layer, a polymer film layer, an organic functional layer, and a cathode layer sequentially disposed on a surface of the substrate layer;

wherein the polymer film layer is formed by the reaction of the organic light-induced material coated on the surface, distal from the anode layer, of the first pixel define layer and the first pixel define layer under the predetermined condition, and the organic light-induced material at least includes the hydroxyl group and the unsaturated carbon-carbon double bond.

In some embodiments, the predetermined condition at least includes ultraviolet light irradiation.

In still another aspect of the embodiments of the present disclosure, a display panel is provided, wherein the display panel is manufactured by the method according to the foregoing another aspect.

In yet still another aspect of the embodiments of the present disclosure, an electronic device is provided, wherein the electronic device includes a power supply, and a display panel connected to the power supply as described above.

BRIEF DESCRIPTION OF THE DRAWINGS

For clearer descriptions of the technical solutions in the embodiments of the present disclosure or in related art more clearly, the following briefly introduces the accompanying drawings required for describing the embodiments or the related art. Apparently, the accompanying drawings in the following description show merely some embodiments of the present disclosure, and persons of ordinary skilled in the art may still derive other drawings from these accompanying drawings without creative efforts.

Figure 1:
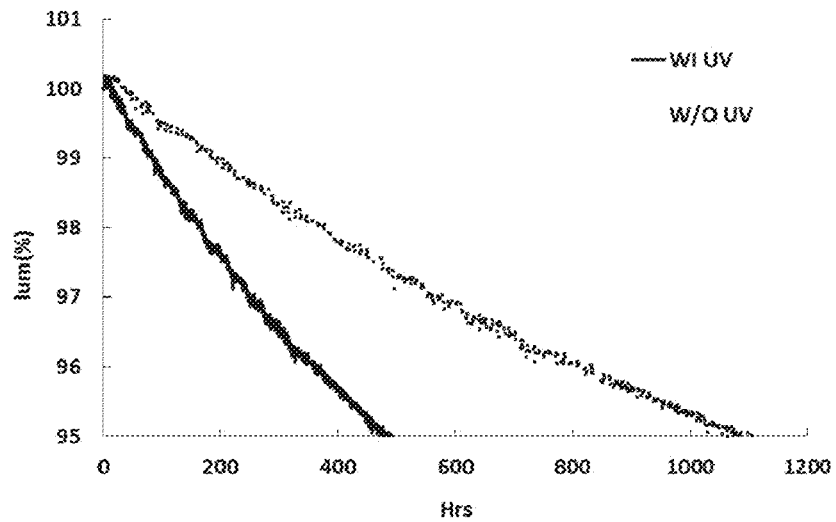
FIG. 1 is a schematic lifetime curve diagram of a display panel in the related art.

Reference numerals and denotations thereof:
1—substrate layer;
2—anode layer;
3—first pixel define layer;
31—organic light-induced material;

32—polymer film layer;
33—second pixel define layer;
4—organic functional layer;
5—cathode layer;
6—third pixel define layer; and
7—modified third pixel define layer.

DETAILED DESCRIPTION

Various solutions and their features according to the embodiments of the present disclosure are described here with reference to the accompanying drawings.

It should be understood that the embodiments of the present disclosure may be modified. The specification is not intended to limit the present disclosure, but the exemplifies the present disclosure as the embodiments. Persons skilled in the art may envisage modifications within the definition and spirit of the present disclosure.

A part of the accompanying drawings included in and formed part of the specification illustrate the embodiments of the present disclosure, and are used to explain the principles of the present disclosure together with the general description given above and the detailed description of the embodiments given below.

By the following description of the preferred form of non-restrictive embodiments by referring to the accompanying drawings, these and other features of the present disclosure become apparent.

It should also be understood that although the present disclosure has been described with reference to specific embodiments, and many other equivalent forms of the present disclosure may be achieved by persons skilled in the art, which have features the same as the claims and therefore are defined by the claims.

In combination with the accompanying drawings, given the following details, the foregoing and other aspects, features and advantages of the present disclosure become more apparent.

Specific embodiments of the present disclosure are described with reference to the accompanying drawings. However, it should be understood that the embodiments are only exemplary ones of the present disclosure, and the present disclosure may be practiced in a variety of ways. Familiar and/or repetitive functions and structures are not described in detail to avoid obfuscating the present disclosure with unnecessary or superfluous details. Therefore, the specific structural and functional details in the present disclosure are not intended to be limited, but merely serve as a basis for claims and a representative basis to inspire persons skilled in the art to use the present disclosure in a variety of ways with any substantially appropriate detailed structure.

The present specification may use the phrases "in an embodiment," "in another embodiment," "in yet embodiment," or "in other embodiments," all of which may refer to one or more embodiments of the same or different embodiments disclosed herein.

An OLED display panel at least includes a red (R) sub-pixel, a green (G) sub-pixel and a blue (B) sub-pixel. Each sub-pixel may include an anode layer, an organic functional layer and a cathode layer. A pixel define layer is disposed between the anode layer and the organic functional layer, and is mainly used to define the position of each sub-pixel of the OLED display panel. Thus, the organic functional layer and cathode layer of sub-pixels with different colors may be evaporated on the anode with PDL as the defined position. Because PDL material include a α-diazo carbonyl structure (α-diazo carbonyl compounds), the compounds are unstable compounds, which may be decomposed by light, heat, Lewis acid, proton acid, some metals, metal salts and metal complexes. Therefore, the PDL material may be degraded step by step under ultraviolet light irradiation, and eventually decomposed into acidic gases such as sulfur dioxide, carbon dioxide, and water molecules. This acidic gas exerts a corrosive effect on the organic functional layer, the anode and the cathode of the sub-pixel, and the water molecule also has a certain destructive effect on materials of the organic functional layer. Furthermore, the OLED display panel has a relatively short lifetime under ultraviolet light (UV) irradiation.

Referring to FIG. 1, the solid line represents the lifetime curve of the OLED display panel under UV irradiation, and the dotted line represents the lifetime curve of OLED display panel without UV irradiation. According to FIG. 1, it can be concluded that the relative brightness of the OLED display panel without UV irradiation is reduced from 100% to 95% for about 1100 hours, while under UV irradiation, the relative brightness of the OLED display panel is reduced from 100% to 95% for 450 hours. The time when the relative brightness of the OLED display panel under ultraviolet irradiation is reduced from 100% to 95%, compared with the time when the relative brightness of the OLED display panel without ultraviolet irradiation is reduced from 100% to 95%, the reduction is about 60%. That is, UV irradiation to the OLED display panel seriously shortens the service lifetime of the OLED display panel, and the relatively low lifetime of the OLED display panel under UV irradiation restricts the application and development of the OLED display technology.

In some embodiments, the degradation process of the PDL material under UV light irradiation is as follows:

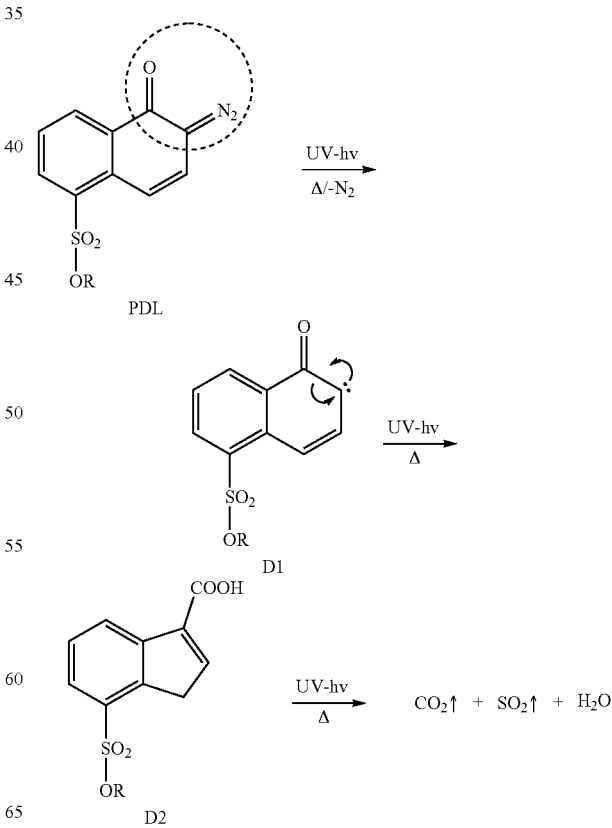

The dotted frame in the above formula shows the α-diazo carbonyl structure of the PDL material. The α-diazo carbonyl structure is unstable, and easily removed one $N_2$ molecule under ultraviolet irradiation (UV-hv) or thermal irradiation (Δ) to generate a first intermediate D1 (the first intermediate D1 is in a transition state). The first intermediate D1 undergoes intramolecular rearrangement under ultraviolet irradiation or thermal irradiation to generate a second intermediate D2, and the second intermediate D2 is further decomposed into small molecules such as $CO_2$, $SO_2$ and $H_2O$ under ultraviolet irradiation.

Figure 2:
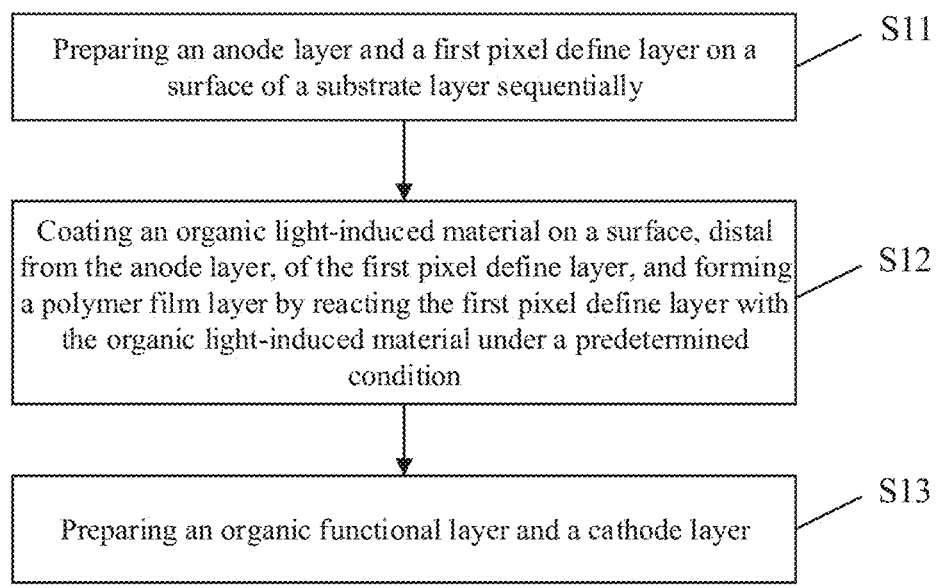
FIG. 2 is a flowchart of a method for manufacturing a display panel according to an embodiment of the present disclosure.

FIG. 2 is a flowchart of a method for manufacturing a display panel according to first embodiment of the present disclosure. The method can solve the problem that the lifetime of the display panel is shortened due to decomposition of the PDL material under ultraviolet light irradiation. Referring to FIG. 2, the method includes the following steps.

In S11, an anode layer and a first pixel define layer are prepared on a surface of a substrate layer sequentially.

In S12, an organic light-induced material is coated on a surface, distal from the anode layer, of the first pixel define layer, and a polymer film layer is formed by reacting the first pixel define layer with the organic light-induced material under a predetermined condition.

In S13, an organic functional layer and a cathode layer are prepared on a surface, distal from the first pixel define layer, of the organic light-induced material.

In some embodiments, the substrate layer at least includes a substrate, a buffer layer, a thin film transistor (TFT) element, a flat layer, and the like. A material of the substrate can be polyimide (PI). The hierarchical structure of the substrate layer is the basic structure in the OLED display panel, and can be prepared by using a prior method, which is not described in detail in the embodiments of the present disclosure.

In an embodiment of the present disclosure, a layer of organic light-induced material Q is coated on a first surface, distal from the anode layer, of the first pixel define layer. The organic light-induced material Q is reacted with the material of the first pixel define layer under a predetermined condition, and a polymer film layer with a protective effect is formed. The polymer film layer may be used as a barrier to wrap the first pixel define layer, which prevents the first pixel define layer from further deep degrading under UV irradiation, prevents other film layers in the display panel from being corroded by acid gas generated from the first pixel define layer, and prolongs the service lifetime of the display panel. In some embodiments, the display panel may be an OLED display panel.

Because the organic light-induced material contains at least a hydroxyl group and an unsaturated carbon-carbon double bond, the first pixel define layer is reacted with the organic light-induced material under the predetermined condition, and a polymer film layer is formed. The polymer film layer may prevent the first pixel defining layer from generating acid gas under ultraviolet light irradiation, thereby preventing other film layers in the display panel from being corroded, and prolonging the service lifetime of the display panel.

In some embodiments, the predetermined condition involved in the embodiment of the present disclosure may refer to an ultraviolet light irradiation environment. When the method according to the embodiment of the present disclosure is actually practiced, parameters such as a wavelength of the ultraviolet light and an irradiation time of the ultraviolet light may be adjusted according to actual needs, which are not limited in the embodiments of the present disclosure.

In some embodiments, the organic light-induced material Q may be an organic material containing a plurality of hydroxyl groups (—OH) and an unsaturated carbon-carbon double bond (—CH=$CH_2$). For example, the organic light-induced material Q may be 2-methyl-2-acrylic acid-2-hydroxy-3-(4-benzoyl-3-hydroxyphenoxy)-2-hydroxypropyl ester, and its schematic structure is as follows:

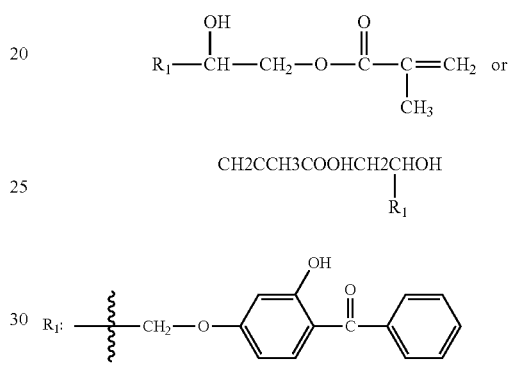

According to the description of the degradation of the PDL material, in order to prevent the PDL material from generating acid gases in decomposition process such as sulfur dioxide, carbon dioxide and the like, the embodiment of the present disclosure can avoid generation of the second intermediate D2 or prevent the second intermediate D2 from decomposing to avoid the generation of acid gas. In addition, the organic light-induced material Q in the embodiment of the present disclosure may also contain a benzophenone functional group, such that the generated intermediate or polymer may contain the benzophenone functional group. The benzophenone functional group has the characteristic of absorbing ultraviolet rays, so the generated intermediate or polymer may have the function of absorbing ultraviolet rays, which further protects the OLED display panel.

In some embodiments, the PDL material easily removes one $N_2$ molecule under ultraviolet irradiation to generate the first intermediate D1. In the case that the organic light-induced material Q is spin-coated on the PDL material, under ultraviolet light irradiation, the first intermediate D1 is reacted with the alcoholic hydroxyl group (—OH) of the organic light-induced material Q to generate a fourth intermediate D4. The unsaturated double bond in the fourth intermediate D4 and the unsaturated carbon-carbon double bond of the organic light-induced material Q are further polymerized to generate the first polymer P1. Compared with the original PDL material, the molecular weight of the first polymer P1 is greatly increased, and the first polymer P1 does not contain an unstable α-diazo carbonyl structure, so the stable first polymer P1 can be used as a polymer film layer to protect the first pixel define layer. In addition, the reaction process at this stage can promptly convert the first intermediate D1 generated by the degradation of the PDL material into the first polymer P1, which can effectively prevent the first intermediate D1 from further reacting to characteristic of absorbing ultraviolet rays, and the thermal decomposition temperature of the third intermediate D3 with a relatively high molecular weight may be increased, such that the display panel has better thermal stability. The schematic reaction of the above stage is shown as follows:

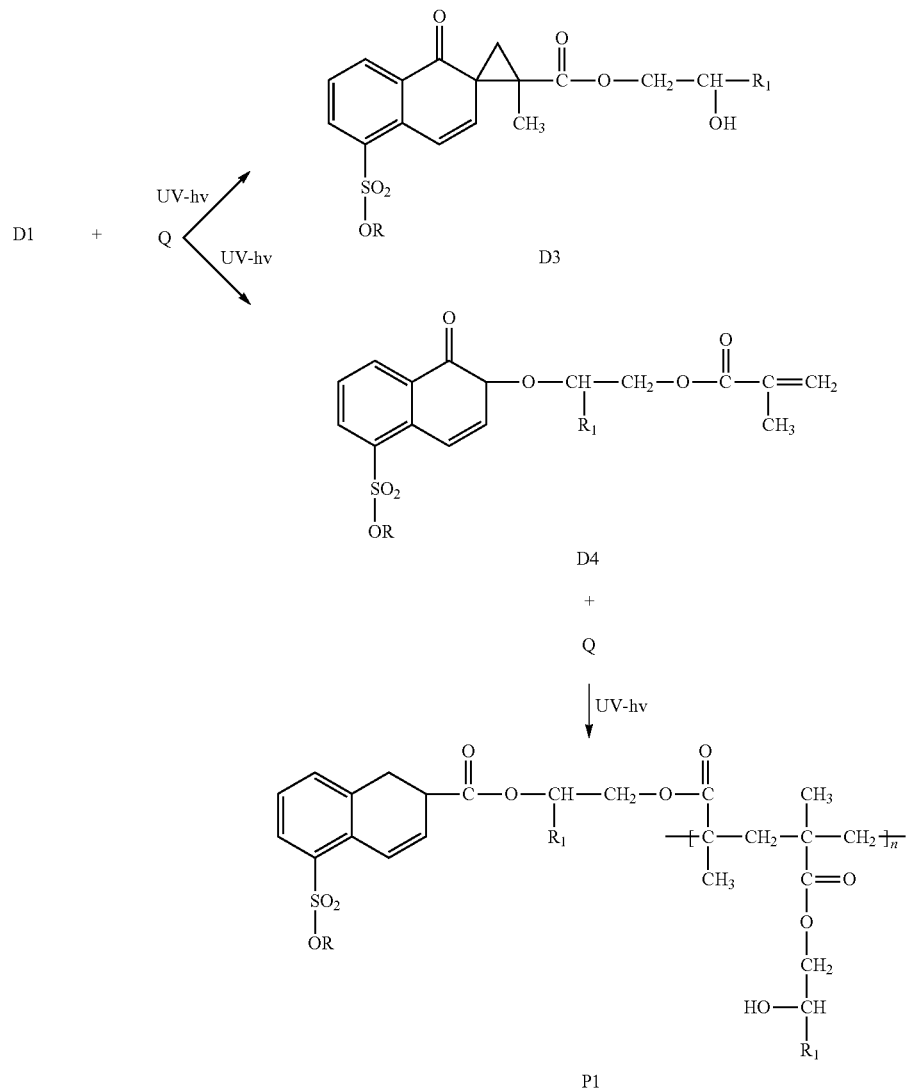

generate the second intermediate D2, thereby reducing the production of acid gas at the root.

In some embodiments, the unsaturated carbon-carbon double bond of the organic light-induced material Q may easily generate free radicals under ultraviolet light irradiation. In the case that the first intermediate D1 is generated, the lone pair electron position of the first intermediate D1 undergoes a cycloaddition reaction with the unsaturated carbon-carbon double bond in the organic light-induced material Q to generate a third intermediate D3. Because the introduced organic light-induced material Q contains the benzophenone functional group, the third intermediate D3 generated by the reaction of organic light-induced material Q and D1 molecule contains the benzophenone functional group. Therefore, the third intermediate D3 may have the Furthermore, in the first intermediates D1 generated in the PDL material, some of the first intermediates D1 may fail to be reacted with the organic light-induced material Q. Therefore, the first intermediates D1 that fail to be reacted with the organic light-induced material Q may be continuously decomposed into the second intermediate D2 under ultraviolet light irradiation, and the hydroxyl (—OH) of the organic light-induced material Q undergo condensation reaction with the carboxyl group (—COOH) of the second intermediate D2 molecule to generate the fifth intermediate D5. The unsaturated carbon-carbon double bond in the fifth intermediate D5 and the unsaturated carbon-carbon double bond in the organic light-induced material Q are further polymerized to generate a second polymer P2. Compared with the original PDL material, the molecular weight of the second polymer P2 is greatly increased, and the second polymer P2 does not contain the unstable α-diazo carbonyl structure, and thus the stable P2 may be used as a polymer film layer to form a protection for the first pixel define layer. In addition, the reaction process at this stage promptly converts the second intermediate D2 into the second polymer P2, which effectively prevents the second intermediate D2 from being further decomposed and generating acid gas, thereby reducing the source of acid gas at the root. The detailed reaction process at this stage is as follows:

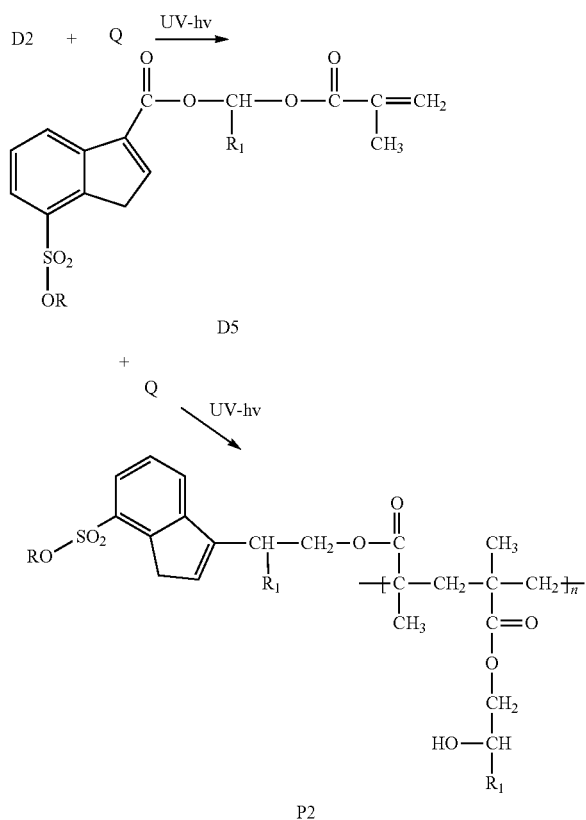

In some embodiments, the organic light-induced material Q may also contain the benzophenone functional group. Therefore, the benzophenone functional group may also be introduced into the structures of the first polymer P1 and the second polymer P2 generated from the organic light-induced material Q in the above reaction. Therefore, when the first polymer P1 and the second polymer P2 are used as a polymer film layer to cover the first pixel define layer, the polymer film layer absorbs the illuminated ultraviolet light, prevents the PDL material from degrading under ultraviolet light, and prevents other layer films of the display panel from being affected by acid gas generated upon the degradation of the PDL material.

In the embodiments of the present disclosure, by introducing organic light-induced material Q, the unstable α-diazo carbonyl structure of the PDL material is eliminated, and a more stable compound is formed. Furthermore, the first intermediate D1 and the second intermediate D2 degraded from the PDL material under ultraviolet light irradiation are transformed into the polymer P1, the polymer P2, the third intermediate D3, the fourth intermediate D4, and the fifth intermediate D5 containing the benzophenone functional group. The polymer P1, the polymer P2, the third intermediate D3, the fourth intermediate D4, and the fifth intermediate D5 all have the characteristics of absorbing irradiated ultraviolet rays, which prevents the PDL material from further degrading, and the molecular weight of the above-generated materials is much higher than the molecular weight of the PDL material, such that the display panel has better heat resistance.

Upon the preparation of the organic light-induced material Q, other film layers in the display panel, such as the organic functional layer and the cathode layer, may be disposed on the surface, distal from the first pixel define layer, of the organic light-induced material Q. The specific preparation method may be implemented directly based on the related art, which is not described in the embodiments of the present disclosure.

Further, upon S12, that is, in the case that the first pixel define layer and the organic light-induced material Q are prepared, a thin layer of the second pixel define layer is then prepared on the surface, distal from the first pixel define layer, of the organic light-induced material Q. The first pixel define layer and the second pixel define layer are both prepared by spin coating, exposure, development and other methods. The organic light-induced material Q may be prepared by spin coating. The ultraviolet light, used for exposure and development during preparing of the second pixel define layer, may cause the organic light-induced material Q be fully reacted with the first pixel define layer to form a polymer film layer with better thermal stability, thereby enhancing the forming efficiency of the polymer film layer and ensuring the stability of the polymer film layer.

In summary, the embodiments of the present disclosure provide a method for manufacturing a display panel, wherein an organic light-induced material may be coated on the first surface, distal from the anode layer, of the first pixel define layer. Because the organic light-induced material at least includes a hydroxyl group and an unsaturated carbon-carbon double bond, the first pixel define layer is reacted with the organic light-induced material under a predetermined condition, and a polymer film layer is formed. The polymer film layer may prevent the first pixel define layer from generating acid gas under ultraviolet light irradiation, thereby preventing other film layers in the display panel from being corroded, and prolonging the service lifetime of the display panel.

Figure 3:
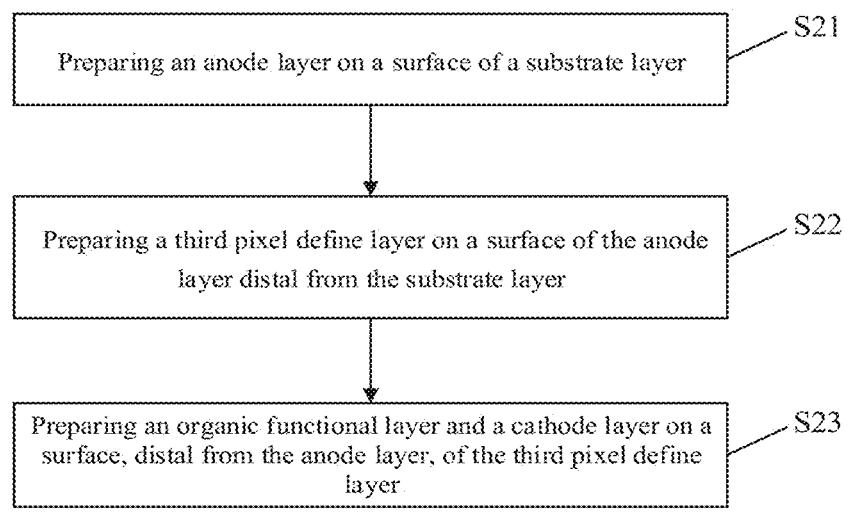
FIG. 3 is a flowchart of another method for manufacturing the display panel according to an embodiment of the present disclosure.

FIG. 3 is a flowchart of another method for manufacturing the display panel according to an embodiment of the present disclosure. Referring to FIG. 3, the method includes the following steps.

In S21, an anode layer is prepared on a surface of a substrate layer.

In S22, a third pixel define layer is prepared on a surface, distal from the substrate layer, of the anode layer.

In S23, an organic functional layer and a cathode layer are prepared on a surface, distal from the anode layer, of the third pixel define layer.

In some embodiments, the method for preparing the substrate layer and the anode layer, the specific structure and the method for preparing the organic functional layer and the cathode layer in the embodiment of the present disclosure are the same as those described in the first embodiment of the present disclosure. In addition, the organic light-induced material used in the embodiment of the present disclosure is also the same as the organic light-induced material in the first embodiment, which is not repeated in the embodiments of the present disclosure.

The difference between this embodiment of the present disclosure and the first embodiment is that the third pixel define layer disposed on the anode layer in the embodiment of the present disclosure is not made of a simple PDL material, but the PDL material uniformly mixed with an organic light-induced material. The doping amount of organic light-induced material accounts for about 0.1% to 0.5% of the total amount of the PDL material. When the third pixel define layer is prepared by spin coating, exposure, development, or the like, the ultraviolet light used in the preparation of the third pixel define layer may be used as the predetermined condition for the reaction between the organic light-induced material and the PDL material in the third pixel define layer to form a modified third pixel define layer.

In some embodiments, the PDL material of the third pixel define layer in the embodiment of the present disclosure is completely the same as the PDL material of the first pixel define layer in the first embodiment. The PDL material will also decompose under ultraviolet light irradiation, thereby producing a first intermediate D1 and a second intermediate D2. In the case that the PDL material of the third pixel define layer is mixed with the organic light-induced material, the possible reaction between PDL material of the third pixel define layer and the organic light-induced material under ultraviolet light irradiation, and the reaction between the first pixel define layer and the organic light-induced material in the above embodiment are the same. In addition, the polymers and intermediates that may be generated during the reaction are also the same, and the specific reaction principles and the production process of each material may be in the above-mentioned embodiment in detail, which is not repeated in the embodiments of the present disclosure.

Under irradiation with ultraviolet light, the third pixel define layer becomes the modified third pixel define layer including the first polymer P1, the second polymer P2, the third intermediate D3, the fourth intermediate D4 and the fifth intermediate D5. The modified third pixel define layer becomes more stable due to containing anti-ultraviolet substances such as P1, P2, D3, D4, and D5, which prevents the modified third pixel define layer from pyrolyzing under ultraviolet light irradiation and further prevents the display panel from being damaged by the effect of the acid gas, and prolongs the lifetime of the display panel.

In some embodiments, the PDL material of the third pixel define layer is directly mixed with organic light-induced material without changing the hierarchical structure of the present display panel. In addition, under ultraviolet light irradiation, the organic light-induced material is reacted with the PDL material to generate polymer with anti-ultraviolet characteristics and various intermediates, thereby preventing the third pixel define layer from being deeply degrading under ultraviolet irradiation. Therefore, from the perspective of material stability, it is possible to fundamentally solve the degradation of the third pixel define layer to generate acid gas, avoid the damage of the acid gas to each film layer (such as the organic functional layer and each electrode) in the display panel, and prolong the service lifetime of the display panel.

In summary, the embodiment of the present disclosure provides a method for manufacturing a display panel, which can mix an organic light-induced material in the third pixel define layer. Because the organic light-induced material contains at least a hydroxyl group and an unsaturated carbon-carbon double bond, the organic light-induced material is reacted with the PDL material in the third pixel define layer under a predetermined condition, and a polymer film layer is formed. The polymer film layer prevents the first pixel define layer from generating acid gas under ultraviolet light irradiation, thereby preventing other film layers in the display panel from being corroded, and prolonging the service lifetime of the display panel.

Figure 4:
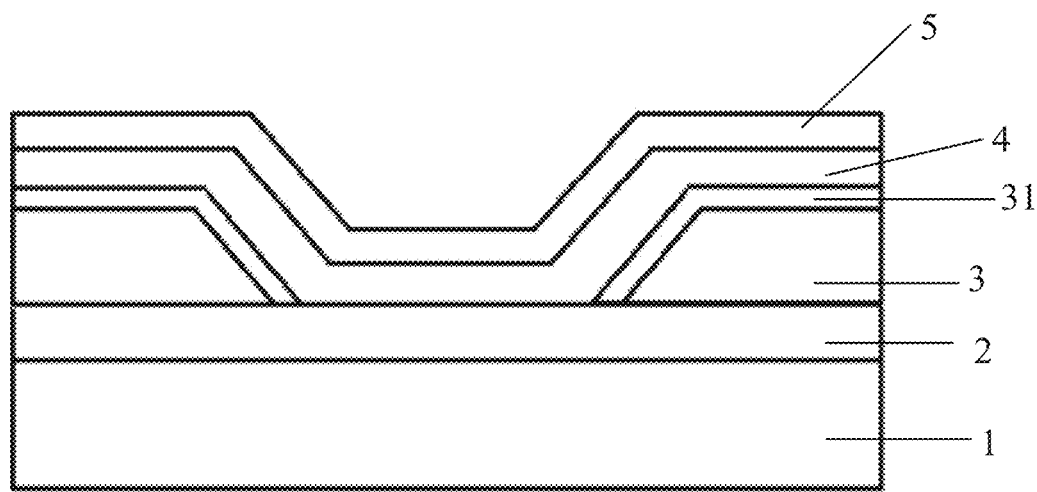
FIG. 4 is a first schematic hierarchical structural diagram of a display panel according to an embodiment of the present disclosure.

FIG. 4 is a first schematic hierarchical structural diagram of a display panel according to an embodiment of the present disclosure. Referring to FIG. 4, the display panel includes a substrate layer 1, an anode layer 2, a first pixel define layer 3, an organic light-induced material 31, an organic functional layer 4, and a cathode layer 5. Under the hierarchical structure shown in FIG. 4, the organic light-induced material 31 is not reacted with the first pixel define layer 3. In this case, the organic light-inducing material 31 is disposed between the first pixel define layer 3 and the organic functional layer 4.

Figure 5:
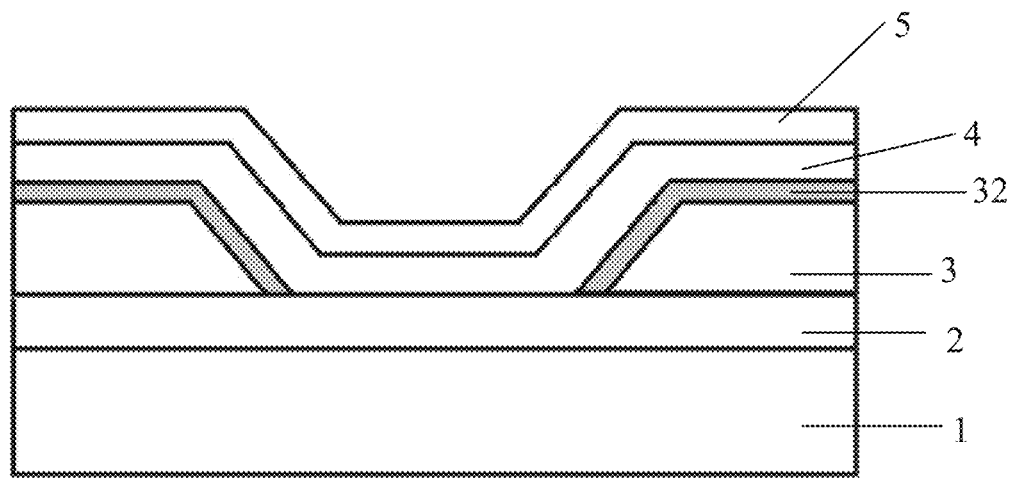
FIG. 5 is a second schematic hierarchical structural of the display panel according to an embodiment of the present disclosure.

FIG. 5 is a second schematic hierarchical structural diagram of the display panel according to an embodiment of the present disclosure. Referring to FIG. 5, the display panel includes a substrate layer 1, an anode layer 2, a first pixel define layer 3, a polymer film layer 32, an organic functional layer 4, and a cathode layer 5. The hierarchical structure shown in FIG. 5 is a hierarchical structure in the case that the organic light-induced material 31 is reacted with the first pixel define layer 3. In this case, the polymer film layer 32 is disposed between the first pixel define layer 3 and the organic functional layer 4. In the case that the polymer film layer 32 is formed, because there is no unstable α-diazo carbonyl structure in the polymer film layer 32, the polymer resulted from the reaction between the organic light-induced material 31 and the first pixel define layer 3, and the intermediates have larger molecular weights, so a more stable protective film is formed to protect the first pixel define layer. In addition, when the polymer film layer 32 has the benzophenone functional group, the polymer film layer 32 has the ability to absorb ultraviolet rays, which prolongs the shortened lifetime of the display panel under ultraviolet light irradiation.

The substrate layer 1 includes at least a substrate, a buffer layer, a TFT element, a flat layer, and the like (not shown in drawings). The substrate may be made of polyimide. The anode layer 2 may at least include a first film layer, a second film layer, and a third film layer (not shown in the drawings). The first film layer and the third film layer may be both made of indium tin oxide (ITO), and the second film layer may be made of silver (Ag). The organic functional layer 4 at least includes a hole injection layer, a hole transportation layer, an electron blocking layer, a light emitting layer, a hole blocking layer, an electron transportation layer, and an electron injection layer (not shown in drawings). The cathode layer 5 may be made of magnesium and silver, wherein, for example, a ratio of magnesium to silver (Mg:Ag) may be between 1:9 and 8:2. The film layers on a side of the cathode layer 5 distal from the substrate (such as a light extraction layer, an encapsulation layer, or an upper functional component layer) may all be prepared based on the related art, which are not described in the embodiments of the present disclosure in detail.

Figure 6:
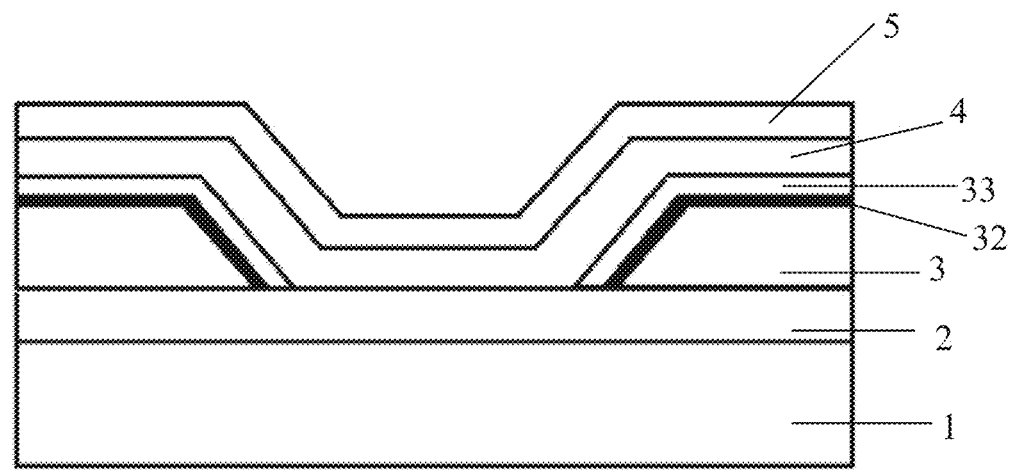
FIG. 6 is a third schematic hierarchical structural of the display panel according to an embodiment of the present disclosure.

FIG. 6 is a third schematic hierarchical structural diagram of the display panel according to an embodiment of the present disclosure. Referring to FIG. 6, the display panel further includes a second pixel define layer 33 disposed between the polymer film layer 32 and the organic functional layer 4. The second pixel define layer 33 may be prepared by spin coating, exposure, development, and other methods.

The ultraviolet light used for preparation of the second pixel defining layer 33 may be used as a predetermined condition for reaction of the organic light-induced material 31 with the first pixel define layer 3 and the second pixel define layer 33. In some embodiments, the thickness of the second pixel define layer 33 in FIG. 6 is a visual effect (a magnification process may be involved), and the second pixel define layer 33 is actually only a thin layer.

In the process of preparing the second pixel define layer 33, the organic light-induced material 31 is reacted with the first pixel define layer 3 and the second pixel define layer 33, and finally a hierarchical structure as shown in FIG. 6 is formed. The polymer film layer 32 resulted from the reaction of the organic light-induced material 31 may form a protective barrier on the first surface of the first pixel define layer.

In some embodiments, by forming a second pixel define layer 33 (sandwich structure design) on a side, distal from the first pixel define layer 3, of the organic light-induced material 31, the production efficiency of the polymer film layer 32 is improved and the stability of the polymer film layer 32 is ensured. In addition, compared with the structure shown in FIG. 4, a polymer protective barrier may be formed in advance to prolong the service lifetime of the display panel.

Figure 7:
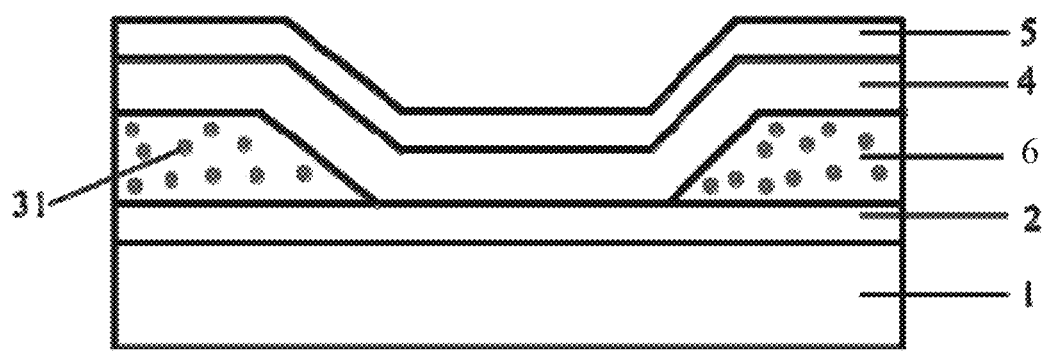
FIG. 7 is a fourth schematic hierarchical structural of the display panel according to an embodiment of the present disclosure.

FIG. 7 is a fourth schematic hierarchical structural diagram of the display panel according to an embodiment of the present disclosure. Referring to FIG. 7, the display panel includes a substrate layer 1, an anode layer 2, a third pixel define layer 6, an organic functional layer 4, and a cathode layer 5. The third pixel define layer 6 is uniformly mixed with organic light-induced material 31. A mixing amount of the organic light-induced material 31 is about 0.1% to 0.5%. The hierarchical structure shown in FIG. 7 is a hierarchical structure of the third pixel define layer 6 in which the organic light-induced material 31 is not reacted with the PDL material.

In some embodiments, the third pixel define layer 6 may be prepared by spin coating, exposure, development, or other methods. In addition, the ultraviolet light used for preparation of the third pixel define layer 6 may be used as a predetermined condition under which the organic light-induced material 31 is reacted with the PDL material in the third pixel define layer 6.

Figure 8:
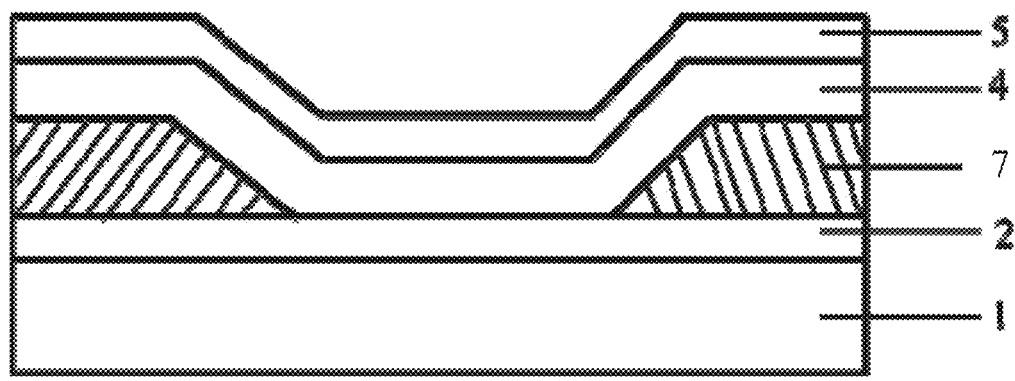
FIG. 8 is a schematic diagram upon reaction between an organic light-induced material of a display panel and a PDL material in a third pixel define layer according to an embodiment of the present disclosure.

FIG. 8 is a fifth schematic hierarchical structural diagram of the display panel according to an embodiment of the present disclosure. In the case that the organic light-induced material 31 is reacted with the PDL material in the third pixel define layer 6 shown in FIG. 8, the third pixel define layer 6 becomes a modified third pixel define layer 7. That is, the hierarchical structure shown in FIG. 8 is a hierarchical structure of the third pixel define layer 6 in which the organic light-induced material 31 is reacted with the PDL material. The modified third pixel define layer 7 may contain the first polymer P1, the second polymer P2, the third intermediate D3, the fourth intermediate D4, the fifth intermediate D5, and the like. In addition, the modified third pixel define layer 7 contains the first polymer P1, the second polymer P2, the third intermediate D3, the fourth intermediate D4, the fifth intermediate D5, and other anti-ultraviolet substances to become more stable, which prevents the modified third pixel define layer 7 from pyrolyzing to generate acid gas under ultraviolet light irradiation. In this way, the OLED display panel is prevented from being damaged under the effect of acid gas, and lifetime of the OLED display panel is prolonged.

Figure 9:
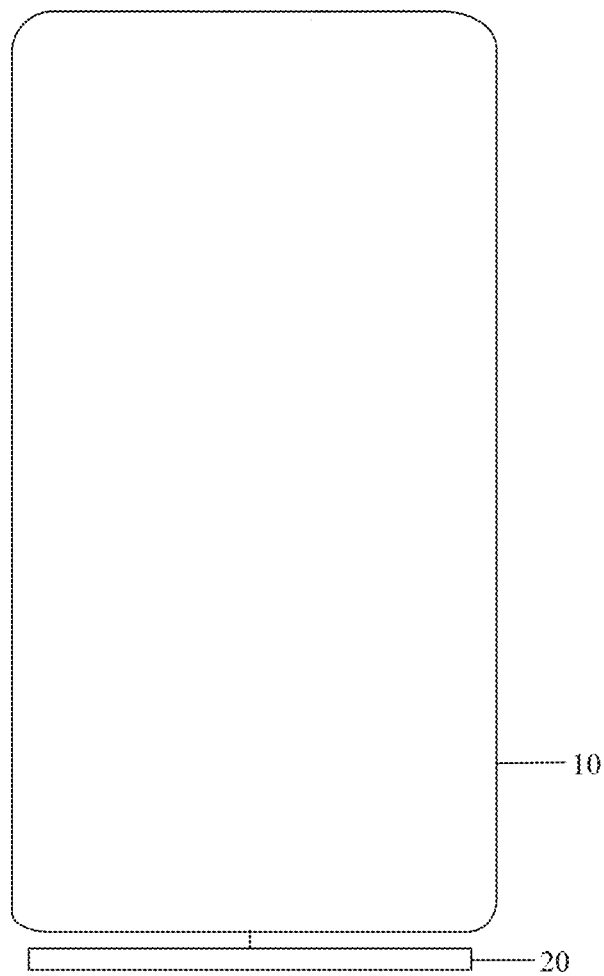
FIG. 9 is a schematic structural diagram of an electronic device according to an embodiment of the present disclosure.

FIG. 9 is a schematic structural diagram of an electronic device according to an embodiment of the present disclosure. Referring to FIG. 9, the electronic device may include a power supply 20 and a display panel 10 connected to the power supply 20. The power supply 20 is configured to supply power to the display panel 10. The display panel 10 may be the display panel according to the above embodiments.

Because the display panel 10 in the electronic device includes an organic light-induced material Q, an unstable α-diazo carbonyl group in the PDL material structure can be eliminated to generate a more stable compound. In addition, the organic light-induced material Q is reacted with the first intermediate D1 and the second intermediate D2 generated by degradation of the PDL material under ultraviolet irradiation, such that the first polymer P1, the second polymer P2, the third intermediate D3, the fourth intermediate D4, and the fifth intermediate D5 containing benzophenone are formed.

Moreover, because the first polymer P1, the second polymer P2, the third intermediate D3, the fourth intermediate D4, and the fifth intermediate D all have the characteristics of absorbing ultraviolet rays, the PDL material may be prevented from further degrading. In this case, the molecular weights of the first polymer P1, the second polymer P2, the third intermediate D3, the fourth intermediate D4, and the fifth intermediate D are much greater than the molecular weight of the PDL material, such that the display panel has better heat resistance, thereby fundamentally reducing the generation of acid gas, and reducing the damage of acid gas to the organic functional layer and each electrode in the display panel.

In some embodiments, the electronic device may be an OLED electronic device, a quantum dot light emitting diode (QLED) electronic device, an electronic paper, a mobile phone, a tablet computer, a television, a monitor, a notebook computer, a digital photo frame, a navigator or any product or component with the display function and the fingerprint recognition function.

Described above are merely exemplary of the embodiments of the present disclosure, and are not intended to limit the present disclosure. Any modifications, equivalent replacements, improvements and the like made based on the design of the present disclosure should be included within the scope of protection of the present disclosure.

What is claimed is:
1. A method for manufacturing a display panel, comprising:
sequentially preparing an anode layer and a first pixel define layer on a surface of a substrate layer;
coating an organic light-induced material on a surface, distal from the anode layer, of the first pixel define layer, and forming a polymer film layer by reacting the first pixel define layer with the organic light-induced material under a predetermined condition, wherein the organic light-induced material at least comprises a hydroxyl group and an unsaturated carbon-carbon double bond; and
preparing an organic functional layer and a cathode layer, wherein both the organic functional layer and the cathode layer are disposed on a surface, distal from the first pixel define layer, of the organic light-induced material;
wherein the predetermined condition at least comprises ultraviolet light irradiation;
wherein forming the polymer film layer by reacting the first pixel with the organic light-induced material under the predetermined condition comprises:
forming a first intermediate under ultraviolet light irradiation by decomposing the first pixel define layer;

forming a fourth intermediate by reacting the first intermediate with the hydroxyl group of the organic light-induced material; and forming a first polymer by polymerizing the fourth intermediate with the unsaturated carbon-carbon double bond of the organic light-induced material; and the polymer film layer at least comprises the first polymer;

wherein forming the polymer film layer by reacting the first pixel define layer with the organic light-induced material under the predetermined condition comprises:

forming a first intermediate under ultraviolet light irradiation by decomposing the first pixel define layer;

forming a second intermediate under ultraviolet light irradiation by decomposing the first intermediate;

forming a fifth intermediate by reacting the second intermediate with the hydroxyl group of the organic light-induced material; and forming a second polymer by polymerizing the fifth intermediate with the unsaturated carbon-carbon double bond of the organic light-induced material; and the polymer film layer at least comprises the second polymer;

wherein the organic light-induced material further comprises a benzophenone functional group.

2. The method according to claim 1, wherein the first polymer at least comprises the benzophenone functional group.

3. The method according to claim 1, wherein the second polymer at least comprises the benzophenone functional group.

4. The method according to claim 1, wherein upon coating the organic light-induced material on the surface, distal from the anode layer, of the first pixel define layer, and forming the polymer film layer by reacting the first pixel define layer with the organic light-induced material under the predetermined condition, the method further comprises:

preparing a second pixel define layer on a surface, distal from the first pixel define layer, of the organic light-induced material; and preparing the organic functional layer and the cathode layer comprises:

preparing the organic functional layer and the cathode layer on a surface, distal from the organic light-induced material, of the second pixel define layer.

5. The method according to claim 2, wherein the second polymer at least comprises the benzophenone functional group;

coating the organic light-induced material on the surface, distal from the anode layer, of the first pixel define layer, and forming the polymer film layer by reacting the first pixel define layer with the organic light-induced material under the predetermined condition further comprise:

preparing a second pixel define layer on a surface, distal from the first pixel define layer, of the organic light-induced material; and preparing the organic functional layer and the cathode layer comprises:

preparing the organic functional layer and the cathode layer on a surface, distal from the second pixel define layer, of the organic light-induced material.

6. A method for manufacturing a display panel, comprising:

preparing an anode layer on a surface of a substrate layer;

preparing a third pixel define layer on a surface, distal from the substrate layer, of the anode layer, wherein materials of the third pixel define layer comprise a pixel define material and an organic light-induced material mixed in the pixel define material;

forming a modified third pixel define layer by reacting the pixel define material with the organic light-induced material under a predetermined condition, wherein the organic light-induced material at least comprises a hydroxyl group and an unsaturated carbon-carbon double bond; and preparing an organic functional layer and a cathode layer on a surface, distal from the anode layer, of the third pixel define layer;

wherein the predetermined condition at least comprises ultraviolet light irradiation;

wherein forming the modified third pixel define layer by reacting the pixel define material with the organic light-induced material under the predetermined condition comprises:

forming a first intermediate under ultraviolet light irradiation by decomposing a pixel define material in the third pixel define layer;

forming a fourth intermediate by reacting the first intermediate with the hydroxyl group of the organic light-induced material; and forming a first polymer by polymerizing the fourth intermediate with the unsaturated carbon-carbon double bond of the organic light-induced material; and the modified third pixel define layer at least comprises the first polymer;

wherein forming the modified third pixel define layer by reacting the pixel define material with the organic light-induced material under the predetermined condition comprises:

forming a first intermediate under ultraviolet light irradiation by decomposing the pixel define material in the third pixel define layer;

forming a second intermediate under ultraviolet light irradiation by decomposing the first intermediate;

forming a fifth intermediate by reacting the second intermediate with the hydroxyl group of the organic light-induced material; and forming a second polymer by polymerizing the fifth intermediate with the unsaturated carbon-carbon double bond of the organic light-induced material; and the modified third pixel define layer at least comprises the second polymer;

wherein the organic light-induced material further comprises a benzophenone functional group.

7. The method according to claim 6, wherein the first polymer at least comprises the benzophenone functional group.

8. The method according to claim 6, wherein the organic light-induced material further comprises the benzophenone functional group; and the second polymer at least comprises the benzophenone functional group.

9. The method according to claim 6, wherein a doping amount of the organic light-induced material accounts for 0.1% to 0.5% of a total amount of the pixel define material of the third pixel define layer.

10. The method according to claim 7, wherein the second polymer at least comprises the benzophenone functional group; the doping amount of the organic light-induced material accounts for 0.1% to 0.5% of a total amount of the pixel define material in the third pixel define layer.

* * * * *